(12) United States Patent
Wang et al.

(10) Patent No.: US 7,943,424 B1
(45) Date of Patent: May 17, 2011

(54) ENCAPSULATION METHOD FOR PACKAGING SEMICONDUCTOR COMPONENTS WITH EXTERNAL LEADS

(75) Inventors: Limin Wang, Songjiang Export Process Zone (CN); Lei Shi, Songjiang Export Process Zone (CN); Liang Zhao, Songjiang Export Process Zone (CN); Feng Ye, Songjiang Export Process Zone (CN)

(73) Assignee: Alpha & Omega Semiconductor Incorporated, Sunnyvale, CA (US)

( * ) Notice: Subject to any disclaimer, the term of this patent is extended or adjusted under 35 U.S.C. 154(b) by 46 days.

(21) Appl. No.: 12/592,597

(22) Filed: Nov. 30, 2009

(51) Int. Cl.
*H01L 21/56* (2006.01)

(52) U.S. Cl. ........ 438/112; 438/113; 438/123; 438/127; 257/E23.031; 257/E23.124; 257/E21.502

(58) Field of Classification Search ................ 438/112, 438/113, 114, 123, 460, 465, 127; 257/E23.124, 257/E23.031, E21.502, E21.506
See application file for complete search history.

(56) References Cited

U.S. PATENT DOCUMENTS

| | | | | |
|---|---|---|---|---|
| 5,238,876 | A * | 8/1993 | Takeuchi et al. | 438/464 |
| 5,976,912 | A * | 11/1999 | Fukutomi et al. | 438/110 |
| 6,498,099 | B1 * | 12/2002 | McLellan et al. | 438/689 |
| 6,541,846 | B2 * | 4/2003 | Vaiyapuri | 257/676 |
| 6,777,265 | B2 * | 8/2004 | Islam et al. | 438/111 |
| 6,841,414 | B1 * | 1/2005 | Hu et al. | 438/106 |
| 7,087,463 | B2 * | 8/2006 | Sackrison et al. | 438/113 |
| 7,247,526 | B1 * | 7/2007 | Fan et al. | 438/123 |
| 7,576,415 | B2 * | 8/2009 | Cha et al. | 257/659 |
| 7,723,157 | B2 * | 5/2010 | Lee et al. | 438/106 |
| 7,892,950 | B2 * | 2/2011 | Magnus et al. | 438/464 |
| 2006/0199308 | A1 * | 9/2006 | Lee et al. | 438/110 |
| 2007/0004088 | A1 * | 1/2007 | Sackrison et al. | 438/113 |
| 2009/0166891 | A1 * | 7/2009 | Lee et al. | 257/782 |

* cited by examiner

*Primary Examiner* — Mary Wilczewski
(74) *Attorney, Agent, or Firm* — Bo-In Lin

(57) ABSTRACT

This invention discloses a method for packaging a semiconductor device with leads extending outside its encapsulation. The method comprises the following steps: Step 1, providing a lead frame comprising a plurality of lead frame units arranged in two dimensional array, each lead frame unit comprising a die pad and a plurality of leads located along two opposite sides of the die pad, attaching a semiconductor chip onto the die pad and electrically connecting the electrodes on each chip to its corresponding leads; Step 2, Encapsulating the chips, the die pads, and the leads with molding material into a plurality of one dimensional plastic encapsulation bars with the leads of each lead frame unit extending out along two opposite sides of the plastic encapsulation bars connecting to a plurality of tie bars substantially parallel to the plastic encapsulation bars; Step 3, Trimming off the tie bars therefore cutting off the connections between the leads to the tie bars while preserving a portion of the leads extending out of the plastic encapsulation bars; and Step 4, Sawing through the plastic encapsulation bars to form a plurality of individual semiconductor components with leads extending outside its encapsulation.

7 Claims, 5 Drawing Sheets

ENCAPSULATION METHOD FOR PACKAGING SEMICONDUCTOR COMPONENTS WITH EXTERNAL LEADS

FIELD OF INVENTION

This invention generally relates to the field of semiconductor device package and packaging process. More particularly, the present invention is related to a semiconductor package configuration and manufacturing method by packaging the semiconductor components with external leads.

BACKGROUND OF THE INVENTION

The conventional technologies for packaging the semiconductor components are still faced with limitations due to the facts that the packaging processes require longer processing time and higher fabrication costs. The limitations of the conventional technologies can be illustrated by the processes of packaging the semiconductor components as described below.

The first one is sawing method, including following steps: Step 1, Chip attachment. Attach semiconductor chips on pre-platted lead frame with a tape attached on the lead frame back side. The lead frame may comprise of a plurality of lead frame units, with each unit containing a die pad and a plurality of leads. The semiconductor chips are attached onto the die pads for each lead frame unit. Step 2, Wire bonding. For each lead frame unit, use metal wire respectively to connect the chips and leads. Step 3, Encapsulation. Encapsulate the chip, die pad and leads into a plastic-sealed body. Step 4, Tape stripping. Strip the tape at the back of whole lead frame to expose the metal lead portion on the bottom surface of the plastic-sealed body. Step 5, Attach UV tape. Attach an UV tape on the front surface of lead frame encapsulation. Step 6, Sawing process. Saw through the plane of the whole encapsulated lead frame in both horizontal and longitudinal directions to form a plurality of singulated semiconductor components. Step 7, Detach UV tape. Solidify the UV tape by using ultraviolet radiation, and detach the cut encapsulated components from the UV tape.

The above sawing method of semiconductor packaging provides higher density of lead frame unit on a whole lead frame therefore provides the benefit of material saving. However, this semiconductor packaging method has the following technical problems. 1. The sawing process simultaneously saws through the plastic-sealed body and the inner metallic leads resulting in metallic burr and distortion at the tips of the leads or even causing de-lamination between two kinds of material, greatly degrades the quality of semiconductor components. 2. The longer time required to saw along both horizontal and longitudinal directions leads to lower productivity. 3. The semiconductor components packaged by this method are unleaded with the leads encapsulated inside the plastic-sealed body except only a portion of the bottom surface of the leads exposed through the bottom of plastic-sealed body for soldering onto a PCB. The soldering quality may degrade due to smaller lead surface area available for soldering.

The second method is lead punch method, including the following steps. Step 1, Chip attachment. On different lead frame units in lead frame, attach the chips onto its die pads, respectively. Step 2, wire bonding. For each lead frame unit, use metal wire to connect its chip and leads. Step 3, plastic encapsulation. Form separate plastic encapsulation for each lead frame unit. Encapsulate the chip, die pad, and some leads of each individual lead frame unit into discrete plastic encapsulation cavities. In this step, the metallic tie bars on the lead frame are taken as divider, thus forming several plastic encapsulation cavities. The metallic tie bar is used to connect different plastic encapsulation cavities through the corresponding leads connected thereon. Step 4, removal of excessive encapsulation material at the edge of plastic-sealed body. Step 5, plating. Plate a metallic layer on external exposed metallic portion on lead frame. Step 6, tie bar punching and separation. Remove the metallic tie bars between different plastic encapsulation cavities by punching off the connection between leads in each lead frame unit and preserve a desired portion of leads extending outside the encapsulation therefore forms a plurality of separated semiconductor component packaged products with external leads.

If the semiconductor components are plastic encapsulated by the above lead-punching method, the density of lead frame unit arranged on lead frame is low in order to provide extra space for punching, thus resulting in low material utilization factor and waste.

Therefore, it is necessary to provide a new and improved packaging process for semiconductor components with external leads to package the semiconductor components with more convenient processing steps to simplify the manufacturing processes and reduced the production costs such that the above discussed limitations and difficulties can be resolved.

SUMMARY OF INVENTION

One aspect of this invention is to provide a method to encapsulate the semiconductor components with external leads. It combines the sawing package method and lead-punching package method of current technologies, to produce the semiconductor package with higher density, lower material consumption, and higher productivity, thus producing the semiconductor components with good quality To achieve the above purpose, the present invention discloses a method to package the semiconductor components with external leads, including the following steps:

Step 1, providing a lead frame comprising a plurality of lead frame units arranged in two dimensional array, each lead frame unit comprising a die pad and a plurality of leads located along two opposite sides of the die pad, attaching a semiconductor chip onto the die pad and electrically connecting the electrodes on each chip to its corresponding leads;

Step 2, Encapsulating the chips, the die pads, and the leads with molding material into a plurality of one dimensional plastic encapsulation bars with the leads of each lead frame unit extending out along two opposite sides of the plastic encapsulation bars connecting to a plurality of tie bars substantially parallel to the plastic encapsulation bars;

Step 3, Trimming off the tie bars therefore cutting off the connections between the leads to the tie bars while preserving a portion of the leads extending out of the plastic encapsulation bars; and Step 4, Sawing through the plastic encapsulation bars to form a plurality of individual semiconductor components with leads extending outside its encapsulation.

In one embodiment the semiconductor packaging method may further comprise a step of removing excessive molding material at the edges of each plastic encapsulation bar after Step 2. In another embodiment the semiconductor packaging method may further comprise a step of plating a metallic layer on a bottom surface of lead frame portion exposed through the encapsulation after Step 2. In another embodiment the semiconductor packaging method may further comprise a step of attaching a UV dicing tape on a bottom surface of lead frame and the plastic encapsulation bars before Step 4.

Between the Step 2 and Step 3, the processes may also comprise a step to fix the plastic encapsulation bar by using rivets at two ends of each bar. Wherein, the rivet passes through the hole on lead frame and fixes and connects plastic encapsulation bar and lead frame together.

In step 5 the process of tie bar trimming may cut off all metallic tie bars between adjacent plastic encapsulation bars, or only cut off the metallic tie bars closest to the plastic encapsulation bar but preserve the intermediate metallic tie bar, to enhance the toughness of lead frame and prevent the lead frame from rupture.

The encapsulation method for semiconductor components with external leads provided in this invention has the following advantages:

1. Because the tie bar trimming step is used to divide up the leads in different lead frame units, and preserve some parts of the leads extruding the plastic-sealed body, it provides plastic encapsulated semiconductor components having a bigger soldering lead area (that is, exposed portion) for the subsequent soldering process therefore improve the soldering quality.
2. Because the tie bar cutting step is used to divide up the leads in different lead frame units, it is only necessary in cutting procedure to conduct the horizontal cutting for the lead frame encapsulated by the plastic-sealed body, without the need to perform both horizontal and longitudinal cutting, thus effectively saving processing time and improving productivity.

Meanwhile, the package method as disclosed avoids sawing through both external plastic-sealed body and inner metallic leads at the same time, so there are no metallic burr and distortion at the tip of leads, nor there are de-laminations between plastic-sealed body and metallic material caused by cutting, thus effectively improving the quality of semiconductor components.
3. Because the dicing tape is attached on the bottom surfaces of lead frame and plastic encapsulation bars before cutting the plastic encapsulation bar, the plastic encapsulation bar is hold steadily in the process of cutting. Moreover, considering the degraded toughness of lead frame caused by tie bar cutting and easily rupture in the process of cutting, the intermediate metallic tie bar may be preserved and only cut out the metallic tie bars closest to the plastic encapsulation bar, to enhance the toughness of lead frame.

These and other objects and advantages of the present invention will no doubt become obvious to those of ordinary skill in the art after having read the following detailed description of the preferred embodiment, which is illustrated in the various drawing figures.

DESCRIPTION OF THE PREFERRED EMBODIMENTS

A detailed explanation of this invention is described below by reference to of FIGS. 1 and 2A to 2H, with selected embodiments as examples to illustrate the semiconductor packages according to the methods and configurations disclosed in this invention.

Figure 1:
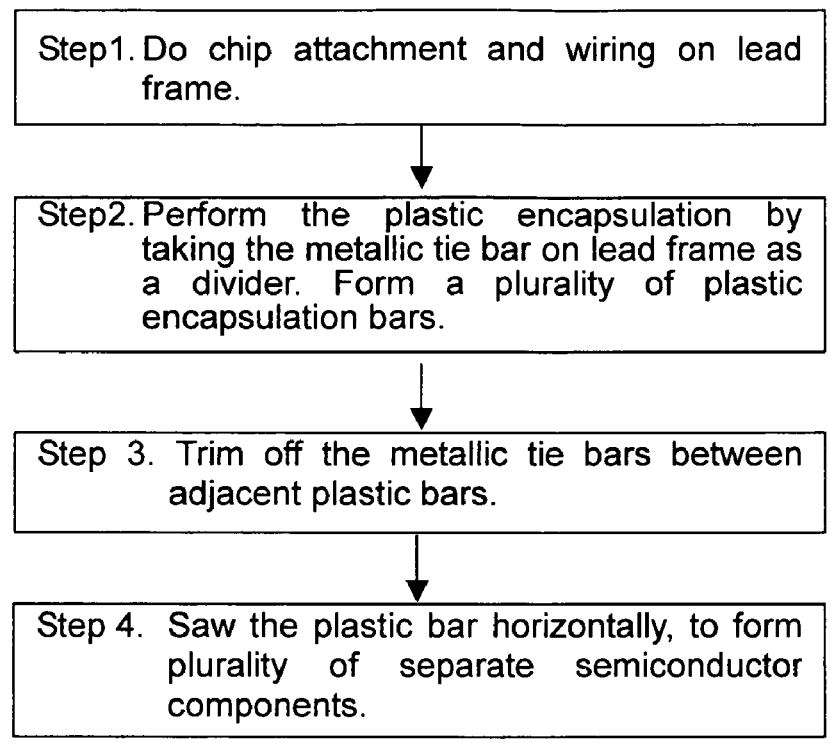
FIG. 1 is a flow chart of the package method for the semiconductor components with external leads according to this invention.

FIG. 1 is a flow chart to illustrate the processing steps of a packaging method according to an embodiment for this invention to package the semiconductor components with external leads. The method includes the following steps:

Step 1, chip attachment and wiring on lead frame.

Figure 2A:
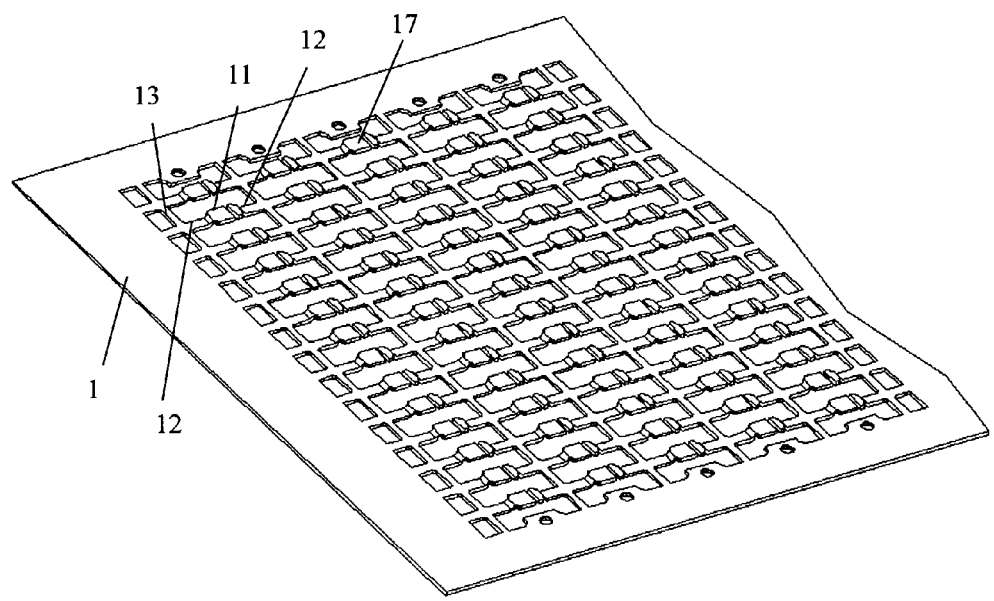
FIGS. 2A-2H are the schematic diagrams of the encapsulation method for the semiconductor components with external leads.

As shown in FIG. 2A, lead frame 1 includes a plurality of lead frame units arranged in a two dimensional array. Each lead frame unit includes a die pad 11 and a plurality of leads 12 located on two opposite sides of the die pad. For simplicity only two leads (one on each side) are shown. The adjacent lead frame units may be connected via leads 12 in horizontal direction to metallic tie bars 13, and via metallic tie bars 13 and leads 12 in longitudinal connection. On each lead frame unit, attach one or more semiconductor chips (not shown in the figure) onto die pad 11, and use metallic connectors (not shown in the figure) to connect the chips and leads 12. In this case, the metal connectors can be bonding wires, metal plates, or metal ribbons.

Step 2, Plastic Encapsulation. Encapsulate the chips, die pads 11, and leads 12 into a plastic-sealed body by applying molding material.

Figure 2B:
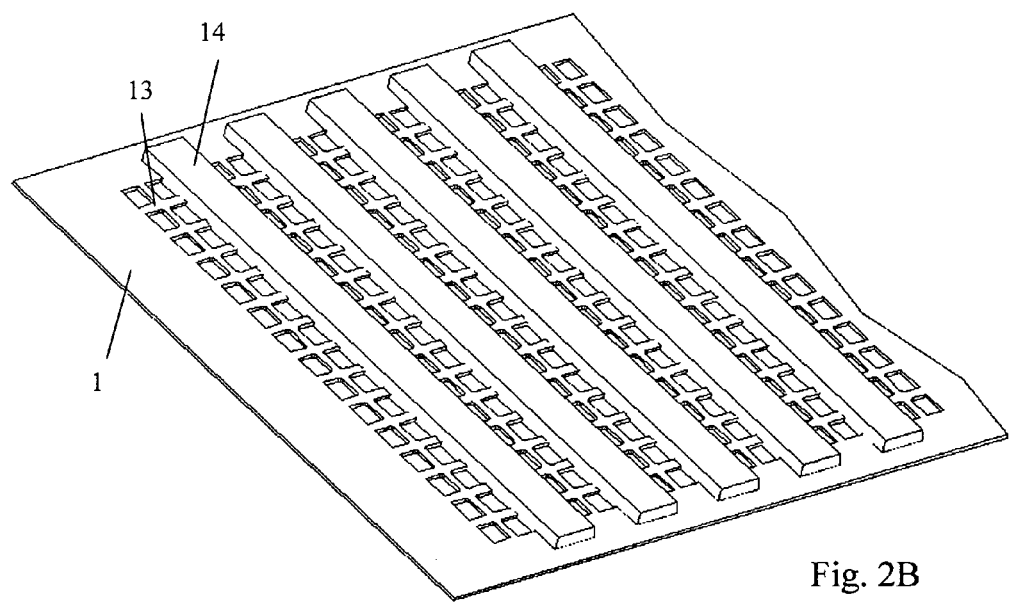

As shown in FIG. 2B, perform the plastic encapsulation by using the metallic tie bars 13 on the lead frame 1 as a dividers, forming plastic encapsulation bars 14 substantially parallel to the metallic tie bars 13. Several lead frame units are arranged sequentially as one dimensional array in each plastic encapsulation bars 14. There is no metallic tie bar connecting between the die pads of adjacent lead frame unit in the one dimensional array of lead frame unit encapsulated in plastic encapsulation bars 14. The leads for each lead frame unit extend outside the encapsulation bars at two opposite sides of plastic encapsulation bar 14 after encapsulation.

After the plastic encapsulation bars 14 are formed, the process may further include an optional step of removal of excessive molding material to remove the residual at the edge of plastic encapsulation bars 14 formed in the process of said encapsulation. The process may further include a step of plating to plate a metallic layer on the exposed bottom portion of lead frame 1. This metallic layer can be tin layer, lead-tin layer, or gold layer.

Figure 2C:
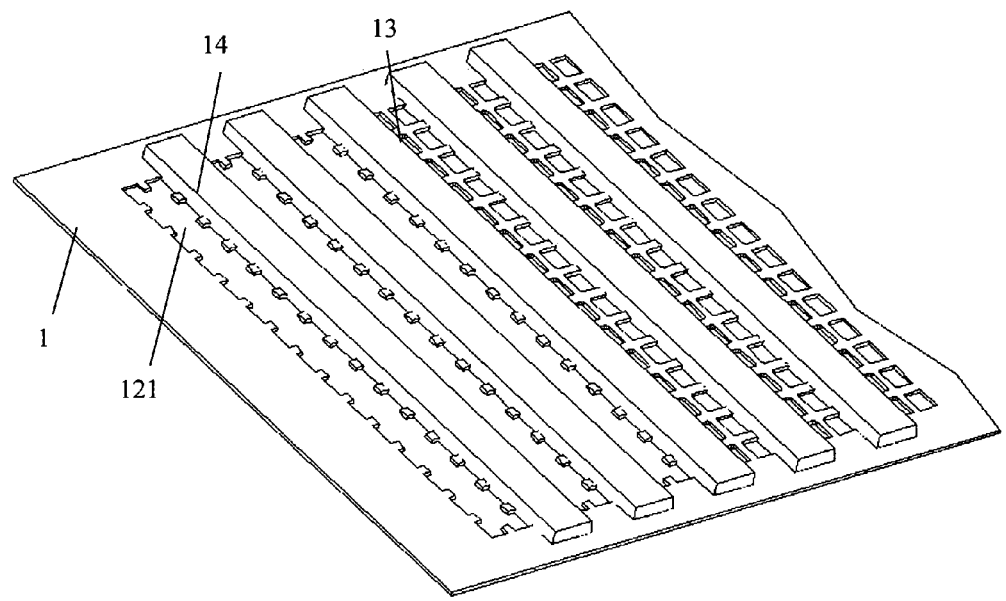
Figure 2D:
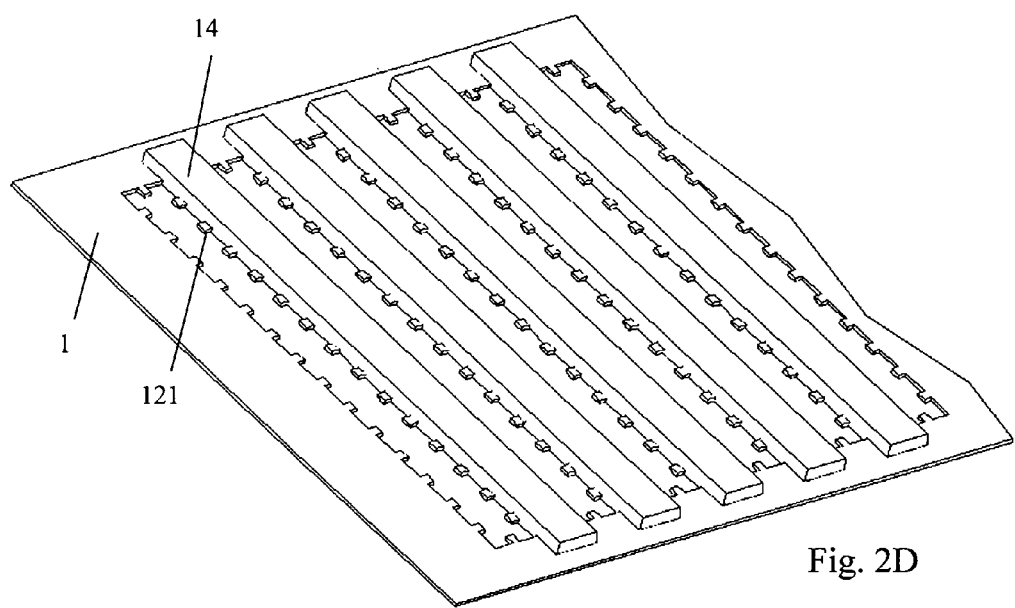

Step 3, trimming tie bar. As shown in FIG. 2C, trim off sequentially the metallic tie bars 13 between adjacent plastic encapsulation bars 14. Divide up and separate the connection between lead 12 of various lead frame units, and preserve the extended lead portion 121 extruding plastic-sealed body. After the tie bar trimming step, the schematic diagram for lead frame 1 is as shown in FIG. 2D.

Figure 2E:
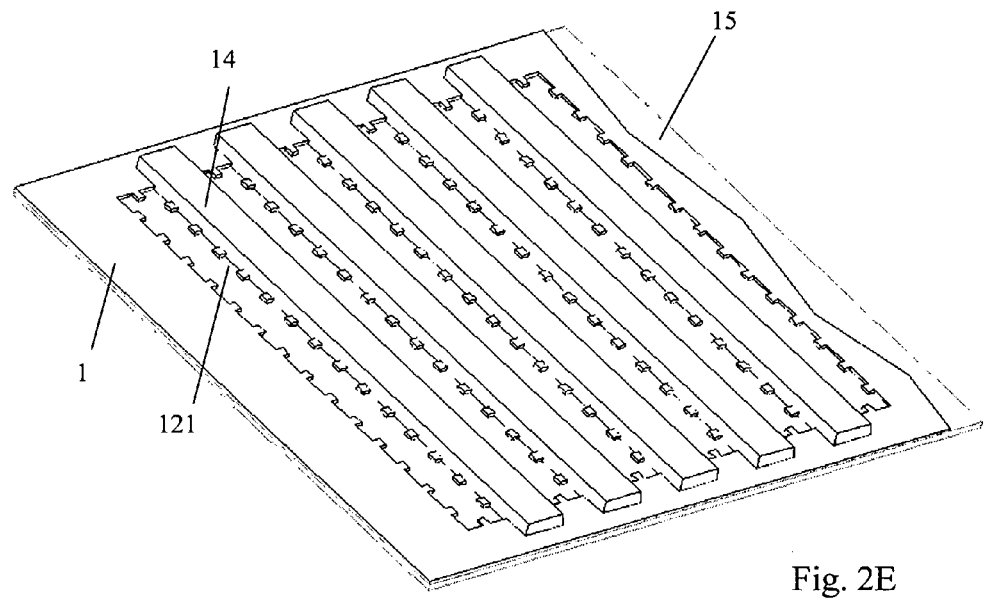

As shown in FIG. 2E, an optional UV tape may be attached as dicing tape (UV tape 15 In this case) on the bottom surface of lead frame 1 and plastic encapsulation bar 14 after trimming off the metallic tie bars.

Figure 2F:
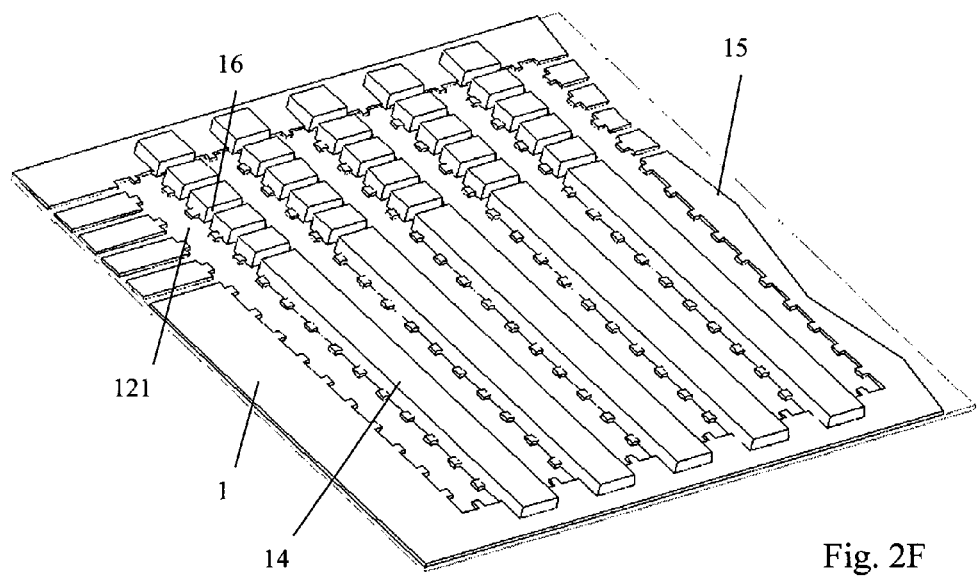
Figure 2G:
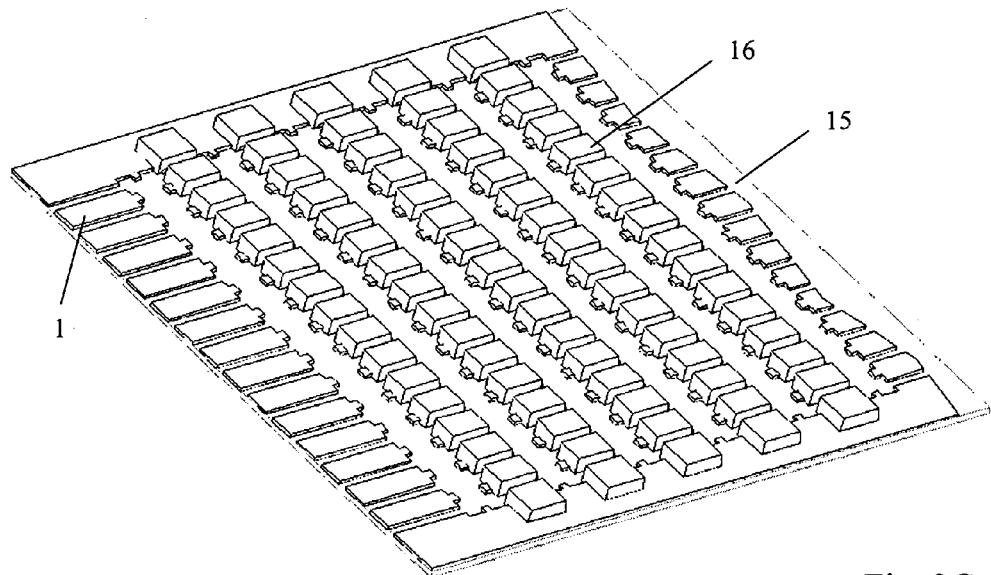

Step 4, Sawing. As shown in FIG. 2F, by sequentially sawing through the plastic encapsulation bars 14 horizontally along the horizontal tie bar sections 13', a plurality of individual semiconductor components 16 are obtained. FIG. 2G is the schematic diagram for the components after sawing step.

Figure 2H:
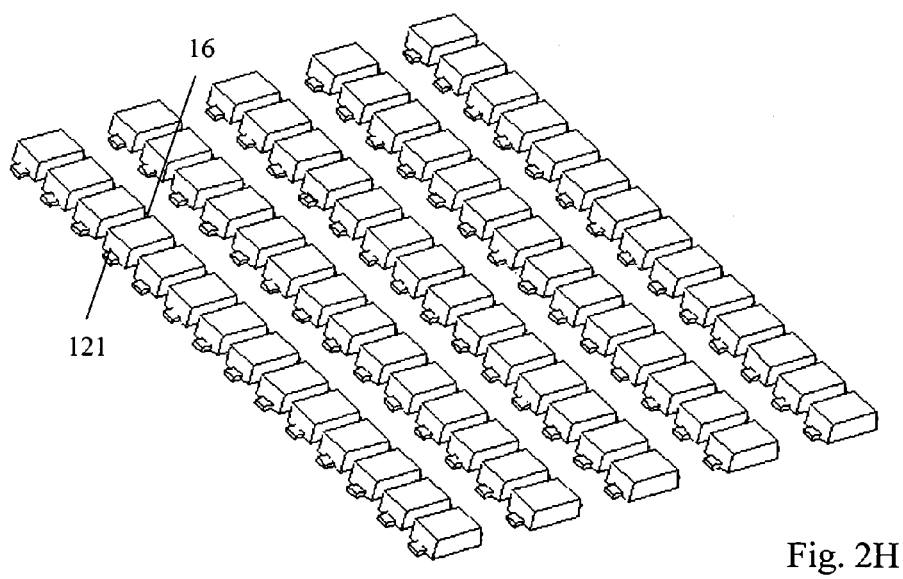

As shown in FIG. 2H, by using ultraviolet radiation, it is possible to easily remove the individual semiconductor components 16 from the UV tape 15 and finish the packaging of semiconductor components with external leads.

In another embodiment of this invention, between the steps 2 and 3, the process may further comprises a step to fix the plastic encapsulation bar 14 by using rivets at two end of the bar 14 (not shown). The rivet may pass through the hole 17 on lead frame 1 as shown in FIG. 2A and fixes plastic encapsulation bars 14 to lead frame 1, to further ensure the steady of plastic encapsulation bar 14.

In another preferred embodiment of this invention, there are three (or more) metallic tie bars 13 in parallel between adjacent plastic encapsulation bars (not shown). In the process of tie bar trimming in step 3, only the two metallic tie bars 13 closest to the plastic encapsulation bars 14 connecting to the leads are cut out, and the intermediate metallic tie bars remain to further enhance the toughness of the lead frame and prevent the whole structure from being ruptured.

The packaging method for semiconductor components with external leads disclosed in this invention provides the following advantages:

1. Because the tie bar trimming step is used to divide the leads in different lead frame units, and preserve some parts of the leads extruding outside the plastic-sealed body, the plastic encapsulated semiconductor components have bigger lead area for soldering in subsequent process, thus effectively improving the soldering quality.

2. because the tie bar trimming step separates the leads in different lead frame units, it is only necessary to conduct the horizontal cutting for the lead frame encapsulated by the plastic-sealed body, without performing horizontal and longitudinal cutting respectively, thus effectively saving processing time and improving productivity.

Meanwhile, the encapsulation method as disclosed avoids cutting through the external plastic-sealed body and inner metallic leads at the same time, so there are no metallic burr and distortion at the tips of leads, nor there are de-laminations between plastic-sealed body and metallic material caused by cutting, thus effectively improving the quality of semiconductor components.

3. Because the UV cutting tape is attached on the bottom surface of plastic encapsulation bar and the lead frame before cutting the plastic encapsulation bar, the plastic encapsulation bar is hold steadily in the process of cutting. Moreover, considering the degraded toughness of lead frame caused by tie bar cutting and easily rupture in the process of cutting, the intermediate metallic tie bar may be preserved and only cut out the metallic tie bars closest to the plastic encapsulation bar, to enhance the toughness of lead frame.

The encapsulation method described in this invention combines lead-sawing package method and lead-punching package method and draws the advantages of both, effectively resolves the technical weaknesses of existing method, and is suitable for packaging micro semiconductor components with leads length above 0.1 mm.

Although the invention contents have been introduced in detail through the preferred examples, it shall be understood that the descriptions are illustrative rather than restrictive. An ordinary skill in the art can make obvious alternation and replacement to the embodiments described after reading this invention. Therefore, the protection scope of this invention shall be restricted by attached claims.

We claim:

1. A method for packaging a semiconductor device with leads extending outside its encapsulation comprising the following steps:
    Step 1, providing a lead frame comprising a plurality of lead frame units arranged in two dimensional array, each lead frame unit comprising a die pad and a plurality of leads located along two opposite sides of the die pad, attaching a semiconductor chip onto the die pad and electrically connecting the electrodes on each chip to its corresponding leads;
    Step 2, Encapsulating the chips, the die pads, and the leads with molding material into a plurality of one dimensional plastic encapsulation bars with the leads of each lead frame unit extending out along two opposite sides of the plastic encapsulation bars connecting to a plurality of tie bars substantially parallel to the plastic encapsulation bars;
    Step 3, Trimming off the tie bars therefore cutting off the connections between the leads to the tie bars while preserving a portion of the leads extending out of the plastic encapsulation bars; and
    Step 4, Sawing through the plastic encapsulation bars to form a plurality of individual semiconductor components with leads extending outside its encapsulation.

2. The semiconductor packaging method of claim 1 further comprising a step of removing excessive molding material at the edges of each plastic encapsulation bar after Step 2.

3. The semiconductor packaging method of claim 1 further comprising a step of plating a metallic layer on a bottom surface of lead frame portion exposed through the encapsulation after Step 2.

4. The semiconductor packaging method of claim 1 further comprising a step of attaching a UV dicing tape on a bottom surface of lead frame and the plastic encapsulation bars before Step 4.

5. The semiconductor packaging method of claim 1 further comprising a step of fixing the plastic encapsulation bars by using rivets at two ends of each bar, wherein, the rivets pass through the holes on lead frame and fix and connect the plastic encapsulation bars and lead frame together.

6. The semiconductor packaging method of claim 1 wherein the lead frame further comprising three or more tie bars in parallel between adjacent plastic encapsulation bars, whereas in step 3 only metallic tie bars connecting to the leads are trimmed off and the rest are preserved for enhancing the toughness of lead frame and preventing the lead frame from rupture.

7. The semiconductor packaging method of claim 1 wherein no direct metallic tie bar connections between the die pads of adjacent lead frame unit within the one dimensional plastic encapsulation bars.

* * * * *